United States Patent
Yao

(10) Patent No.: US 9,634,036 B1
(45) Date of Patent: Apr. 25, 2017

(54) METAL OXIDE THIN-FILM TRANSISTOR, METHOD OF FABRICATING THE SAME, AND ARRAY SUBSTRATE

(71) Applicant: Shenzhen China Star Optoelectronics Technology Co., Ltd., Shenzhen (CN)

(72) Inventor: Jiangbo Yao, Shenzhen (CN)

(73) Assignee: Shenzhen China Star Optoelectronics Technology Co., Ltd., Shenzhen (CN)

( * ) Notice: Subject to any disclaimer, the term of this patent is extended or adjusted under 35 U.S.C. 154(b) by 0 days.

(21) Appl. No.: 15/120,753

(22) PCT Filed: Jun. 3, 2016

(86) PCT No.: PCT/CN2016/084762
§ 371 (c)(1),
(2) Date: Aug. 23, 2016

(30) Foreign Application Priority Data

Mar. 11, 2016 (CN) .......................... 2016 1 0140444

(51) Int. Cl.
*H01L 29/786* (2006.01)
*H01L 27/12* (2006.01)
*H01L 29/36* (2006.01)

(52) U.S. Cl.
CPC ............ *H01L 27/124* (2013.01); *H01L 29/36* (2013.01); *H01L 29/7869* (2013.01)

(58) Field of Classification Search
CPC H01L 29/7869; H01L 27/1225; H01L 27/124
See application file for complete search history.

(56) References Cited

U.S. PATENT DOCUMENTS

| | | | | |
|---|---|---|---|---|
| 8,633,480 B2* | 1/2014 | Yamazaki | .............. | G11C 19/28 257/43 |
| 9,048,094 B2* | 6/2015 | Miyanaga | ........... | H01L 29/7869 |
| 2010/0051949 A1* | 3/2010 | Yamazaki | ........... | H01L 29/4908 257/57 |
| 2011/0079778 A1* | 4/2011 | Yamazaki | ......... | H01L 21/02554 257/43 |
| 2011/0309353 A1* | 12/2011 | Kaneko | ............... | H01L 27/0688 257/43 |
| 2014/0197404 A1* | 7/2014 | Chiang | ............... | H01L 27/1225 257/43 |
| 2014/0326994 A1* | 11/2014 | Tanaka | ................ | H01L 29/7869 257/43 |
| 2015/0200208 A1* | 7/2015 | Lee | ...................... | H01L 27/1225 257/43 |
| 2015/0200304 A1* | 7/2015 | Kim | ..................... | H01L 29/7869 257/43 |
| 2016/0020327 A1* | 1/2016 | Yamakawa | ......... | H01L 29/7869 257/43 |
| 2016/0181430 A1* | 6/2016 | Ahmed | ............... | H01L 29/7869 257/43 |

* cited by examiner

Primary Examiner — Evan Pert

(57) ABSTRACT

The present disclosure proposes a metal oxide thin-film transistor, a method of fabricating the metal oxide thin-film transistor, and an array substrate. The metal oxide TFT includes a glass substrate, a gate, a gate insulating layer, a metal oxide active layer, an etching blocking layer with a source hole and a drain hole thereon, a blocking spread layer including a source blocking layer and a drain blocking layer, a source, and a drain. The blocking spread layer is doped with boron ions and/or phosphorus ions of predetermined concentration.

16 Claims, 3 Drawing Sheets

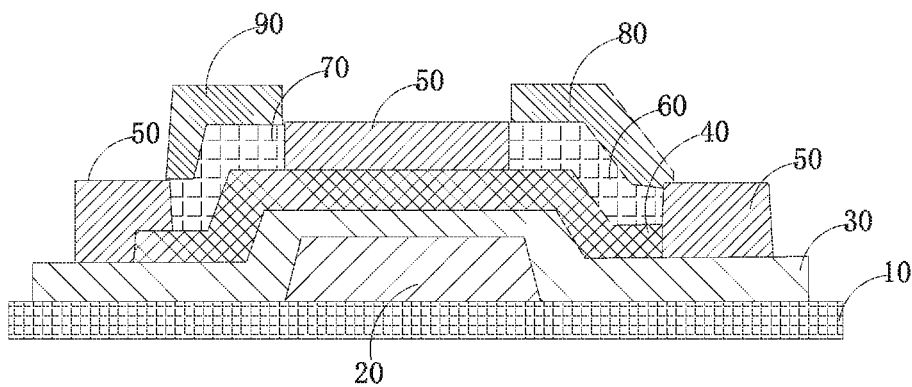

Fig. 1

```
┌─────────────────────────────────────────────┐
│ Form a gate, a gate insulating layer, a     │── 201
│ metal oxide active layer, and an etching    │
│ blocking layer successively on a glass      │
│ substrate. A source hole and a drain hole   │
│ are arranged on the etching blocking layer. │
└─────────────────────────────────────────────┘
                    ↓
┌─────────────────────────────────────────────┐
│ Form a blocking spread layer on the metal   │
│ oxide active layer. The blocking spread     │
│ layer comprises a source blocking layer     │
│ and a drain blocking layer. The source      │── 202
│ blocking layer and the drain blocking layer │
│ are arranged in the source hole and the     │
│ drain hole, respectively. The source        │
│ blocking layer and the drain blocking layer │
│ are connected to the metal oxide active     │
│ layer.                                      │
└─────────────────────────────────────────────┘
                    ↓
┌─────────────────────────────────────────────┐
│ Dope boron ions and/or phosphorus ions of   │── 203
│ predetermined concentration in the blocking │
│ spread layer.                               │
└─────────────────────────────────────────────┘
                    ↓
┌─────────────────────────────────────────────┐
│ Form a source on the source blocking layer, │── 204
│ and form a drain on the drain blocking      │
│ layer.                                      │
└─────────────────────────────────────────────┘
```

Fig. 2

METAL OXIDE THIN-FILM TRANSISTOR, METHOD OF FABRICATING THE SAME, AND ARRAY SUBSTRATE

RELATED APPLICATIONS

This application is a National Phase of PCT Patent Application No. PCT/CN2016/084762 having International filing date of Jun. 3, 2016, which claims the benefit of priority of Chinese Patent Application No. 201610140444.4 filed on Mar. 11, 2016. The contents of the above applications are all incorporated by reference as if fully set forth herein in their entirety.

FIELD AND BACKGROUND OF THE INVENTION

1. Field of the Invention

The present invention relates to the field of displays, and more particularly, to a metal oxide thin-film transistor (TFT), a method of fabricating the metal oxide TFT, and an array substrate.

2. Description of the Prior Art

Copper features excellent electric conductivity so it is usually used as an electrode when a metal oxide TFT is produced. Copper, with certain diffusivity, is inclined to be spread to a metal oxide active layer when a TFT is conducted, which may affect the electric conductivity of the metal oxide active layer. Therefore, instead of using copper alone, multiple layers are used in the conventional technology, including a blocking spread layer and a copper layer. The blocking layer is usually formed by molybdenum (Mo) or titanium (Ti) to prevent copper from spreading to the metal oxide active layer.

However, the conventional technology has two shortcomings. One is that, it is impossible to fabricate a blocking spread layer with a larger thickness by a manufacturer because of the costs and the thickness of devices have to been controlled strictly though the fact is that the thicker the blocking spread layer is, the better effect of preventing copper from spreading to the metal oxide active layer is. The other is that, annealing is conducted on the fabricated TFT for improving the performance of the device. However, annealing has to be conducted in the environment of high temperature. It means that copper also spreads rapidly in the environment of high temperature. Because the blocking spread layer is poor in preventing copper from spreading, both of the electric conductivity of the metal oxide active layer and the performance of the TFT are negative affected.

Therefore, it is necessary to improve the faulty conventional technology.

SUMMARY OF THE INVENTION

An object of the present invention is to propose a metal oxide TFT, a method of fabricating the metal oxide TFT, and an array substrate in order to solve the problem of a conventional blocking spread layer having low spreading efficiency.

According to the present invention, a metal oxide thin-film transistor (TFT) comprises: a glass substrate;
a gate, arranged on the glass substrate;
a gate insulating layer, arranged on the gate and the glass substrate;
a metal oxide active layer, arranged on the gate insulating layer;
an etching blocking layer, arranged on the metal oxide active layer and the gate insulating layer; a source hole and a drain hole arranged on the etching blocking layer;
a blocking spread layer, comprising a source blocking layer and a drain blocking layer;
the source blocking layer and the drain blocking layer arranged in the source hole and the drain hole, respectively, and connected to the metal oxide active layer; the blocking spread layer doped with boron ions and/or phosphorus ions of predetermined concentration;
a source, arranged on the source blocking layer; and
a drain, arranged on the drain blocking layer.

In one aspect of the present invention, the blocking spread layer comprises molybdenum (Mo) and titanium (Ti).

In another aspect of the present invention, the metal oxide active layer is an indium gallium zinc oxide (IGZO) active layer.

In another aspect of the present invention, a thickness of the blocking spread layer ranges from 100 Å to 500 Å.

In still another aspect of the present invention, the blocking spread layer is doped with the boron ions and the phosphorus ions, and doping concentration of the boron ions and the phosphorus ions ranges from 10% to 90%.

In yet another aspect of the present invention, the doping concentration gradually decreases from one side of the blocking spread layer near the source and the drain to one side of the blocking spread layer near the metal oxide active layer.

According to the present invention, an array substrate comprises a metal oxide thin-film transistor (TFT). The metal oxide TFT comprises:
a glass substrate;
a gate, arranged on the glass substrate;
a gate insulating layer, arranged on the gate and the glass substrate;
a metal oxide active layer, arranged on the gate insulating layer;
an etching blocking layer, arranged on the metal oxide active layer and the gate insulating layer; a source hole and a drain hole arranged on the etching blocking layer;
a blocking spread layer, comprising a source blocking layer and a drain blocking layer;
the source blocking layer and the drain blocking layer arranged in the source hole and the drain hole, respectively, and connected to the metal oxide active layer; the blocking spread layer doped with boron ions and/or phosphorus ions of predetermined concentration;
a source, arranged on the source blocking layer; and
a drain, arranged on the drain blocking layer.

In one aspect of the present invention, the blocking spread layer comprises molybdenum (Mo) and titanium (Ti).

In another aspect of the present invention, the metal oxide active layer is an indium gallium zinc oxide (IGZO) active layer.

In another aspect of the present invention, a thickness of the blocking spread layer ranges from 100 Å to 500 Å.

In another aspect of the present invention, the blocking spread layer is doped with the boron ions and the phosphorus ions, and doping concentration of the boron ions and the phosphorus ions ranges from 10% to 90%.

In still another aspect of the present invention, the doping concentration gradually decreases from one side of the blocking spread layer near the source and the drain to one side of the blocking spread layer near the metal oxide active layer.

In yet another aspect of the present invention, the blocking spread layer comprises molybdenum (Mo) and titanium (Ti); the metal oxide active layer is an indium gallium zinc oxide (IGZO) active layer; a thickness of the blocking spread layer ranges from 100 Å to 500 Å; the blocking spread layer is doped with the boron ions and the phosphorus ions, and doping concentration of the boron ions and the phosphorus ions ranges from 10% to 90%; and the doping concentration gradually decreases from one side of the blocking spread layer near the source and the drain to one side of the blocking spread layer near the metal oxide active layer.

According to the present invention, a method of fabricating a metal oxide thin-film transistor (TFT) comprises:

forming a gate, a gate insulating layer, a metal oxide active layer, and an etching blocking layer successively on a glass substrate; arranging a source hole and a drain hole on the etching blocking layer;

forming a blocking spread layer on the metal oxide active layer; the blocking spread layer comprising a source blocking layer and a drain blocking layer; arranging the source blocking layer and the drain blocking layer in the source hole and the drain hole, respectively; connecting the source blocking layer and the drain blocking layer to the metal oxide active layer, respectively;

doping boron ions and/or phosphorus ions of predetermined concentration into the blocking spread layer;

forming a source on the source blocking layer, and forming a drain on the drain blocking layer.

Compared with the conventional technology, the metal oxide TFT comprises the blocking spread layer doped with boron ions and/or phosphorus ions in the present invention. The benefits of the present invention are to improve the blocking ability of the blocking spread layer to the spread of copper ions of the source and the drain and to prevent copper ions of the source and the drain from spreading to a metal oxide active layer and affecting the ability of electric conductivity of the metal oxide active layer in the environment of high temperature.

These and other features, aspects and advantages of the present disclosure will become understood with reference to the following description, appended claims and accompanying figures.

BRIEF DESCRIPTION OF THE SEVERAL VIEWS OF THE DRAWINGS

FIG. 1 is a schematic diagram of the structure of a metal oxide thin-film transistor (TFT) according to one preferred embodiment of the present invention.

FIG. 2 is a schematic diagram of a method of fabricating the metal oxide TFT according to the preferred embodiment of the present invention.

DESCRIPTION OF THE SPECIFIC EMBODIMENTS OF THE INVENTION

Figure 3A:
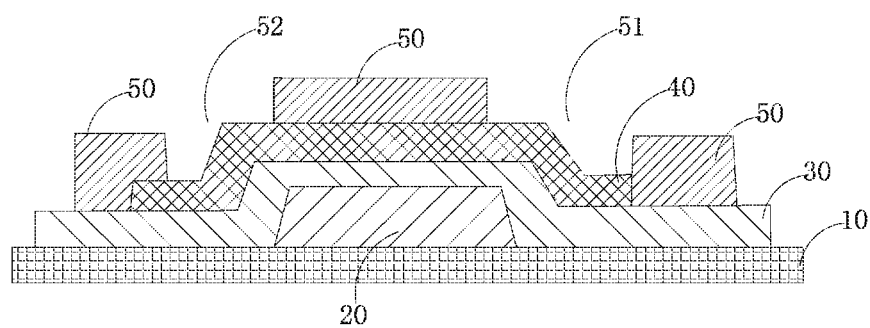
FIGS. 3A, 3B, 3C, 3D, and 3E show diagrams of fabricating the metal oxide TFT according to the preferred embodiment of the present invention.

Spatially relative terms, such as "beneath", "below", "lower", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures.

In figures, the same elements are labeled as the same numerals.

Please refer to FIG. 1. FIG. 1 is a schematic diagram of the structure of a metal oxide thin-film transistor (TFT) according to one preferred embodiment of the present invention. The metal oxide TFT comprises a glass substrate 10, a gate 20, a gate insulating layer 30, a metal oxide active layer 40, an etching blocking layer 50, a blocking spread layer (now shown in the figure), a source 80, and a drain 90.

The gate 20 is arranged on the glass substrate 10. The gate insulating layer 30 is arranged on the gate 20 and the glass substrate 10. The metal oxide active layer 40 is arranged on the gate insulating layer 30. The etching blocking layer 50 is arranged on the metal oxide active layer 40 and the gate insulating layer 30. A source hole and a drain hole are arranged on the etching blocking layer 50. The blocking spread layer comprises a source blocking layer 60 and a drain blocking layer 70. The source blocking layer 60 and the blocking spread layer are arranged in the source hole and the drain hole, respectively. The source blocking layer 60 and the drain blocking layer 70 are connected to the metal oxide active layer 40. Boron ions and/or phosphorus ions of predetermined concentration are doped in the blocking spread layer, i.e. the source blocking layer 60 and the drain blocking layer 70. The source 80 is arranged on the source blocking layer 60. The drain 90 is arranged on the drain blocking layer 70. Copper (Cu) is deposited to form the source 80 and the drain 90.

The blocking spread layer comprises molybdenum (Mo) and/or titanium (Ti). The blocking spread layer is formed with the method of physical vapor deposition (PVD). The metal oxide active layer 40 is an indium gallium zinc oxide (IGZO) active layer. The metal oxide active layer 40 is formed with the method of PVD. The thickness of the blocking spread layer ranges from 100 to 500 Angstrom (Å). Boron ions and phosphorus ions are doped in the blocking spread layer. Doping concentration of boron ions and phosphorus ions is between ten percent and ninety percent.

Preferably, the doping concentration gradually decreases from one side of the blocking spread layer near the source 80 and the drain 90 to one side of the blocking spread layer near the metal oxide active layer 40. It implies that the energy of ion infusion is economized and that the blocking efficiency of ion spreading is improved.

The metal oxide TFT comprises the blocking spread layer doped with boron ions and/or phosphorus ions in the present invention. The benefits of the present invention are to improve the blocking ability of the blocking spread layer to the spread of copper ions of the source and the drain and to prevent copper ions of the source and the drain from spreading to a metal oxide active layer and affecting the ability of electric conductivity of the metal oxide active layer in the environment of high temperature.

An array substrate is further proposed by the present invention. The array substrate comprises the above-mentioned metal oxide TFT.

Please refer to FIG. 2. FIG. 2 is a schematic diagram of a method of fabricating the metal oxide TFT according to the preferred embodiment of the present invention. The method comprises following steps:

Step S201: Form a gate, a gate insulating layer, a metal oxide active layer, and an etching blocking layer successively on a glass substrate. A source hole and a drain hole are arranged on the etching blocking layer.

Step S202: Form a blocking spread layer on the metal oxide active layer. The blocking spread layer comprises a source blocking layer and a drain blocking layer. The source blocking layer and the drain blocking layer are arranged in the source hole and the drain hole, respectively. The source blocking layer and the drain blocking layer are connected to the metal oxide active layer.

Step S203: Dope boron ions and/or phosphorus ions of predetermined concentration in the blocking spread layer.

Step S204: Form a source on the source blocking layer, and form a drain on the drain blocking layer.

Each of the steps for the method of fabricating the metal oxide TFT will be elaborated as follows. Refer to FIG. 3A to FIG. 3E as well.

In Step S201, the material of the gate 20 is any one of molybdenum (Mo), titanium (Ti), aluminum (Al), and copper (Cu) or a stacked combination of molybdenum (Mo), titanium (Ti), aluminum (Al), and copper (Cu), as FIG. 3A shows. The gate 20 is formed with the method of PVD. The gate insulating layer 30 is made of silica (SiO2) or silicon nitride (Si3N4) with the method of chemical vapor deposition (CVD). The metal oxide active layer 40 is the IGZO active layer. A source hole 51 and a drain hole 52 are formed on the etching blocking layer 50.

In Step S202, the blocking spread layer formed on the metal oxide active layer 40 is made of molybdenum (Mo) and/or titanium (Ti) with the method of PVD. The thickness of the blocking spread layer ranges from one hundred Å to five hundred Å. The blocking spread layer comprises the source blocking layer 60 and the drain blocking layer 70.

Figure 3B:
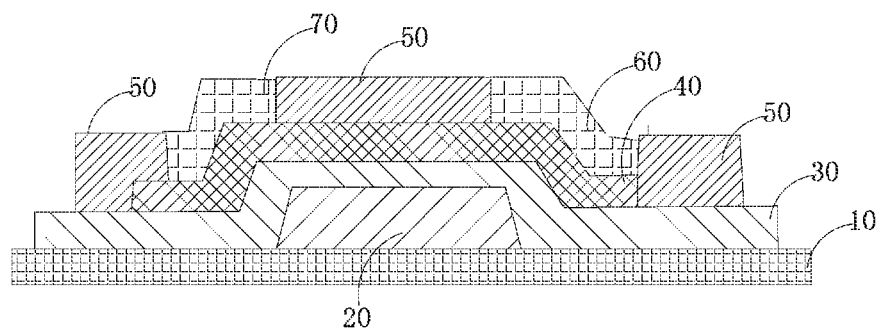
Figure 3C:
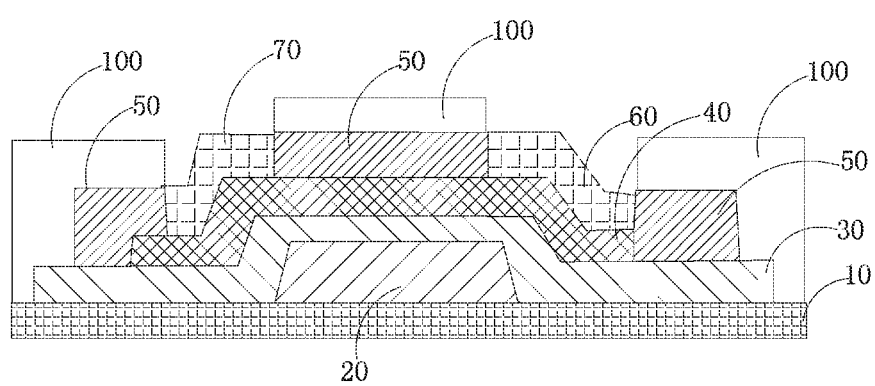

In Step S203, the etching blocking layer undergoes lithography before the blocking spread layer undergoes doping, as FIG. 3B shows. The ion-injection area, i.e., the source blocking layer and the drain blocking layer, is partially exposed. The other part of the ion-injection area is covered by a photoresist layer 100 in order to avoid damage when ions are injected. As for the following doping, boron ions or phosphorus ions are used. Otherwise, both of boron ions and phosphorus ions are used in doping. The doping concentration ranges from ten percent to ninety percent. Preferably, the doping concentration gradually decreases from one side of the blocking spread layer near the source 80 and the drain 90 to one side of the blocking spread layer near the metal oxide active layer 40. It implies that the energy of ion infusion is economized and that the blocking efficiency of ion spreading is improved.

Figure 3D:
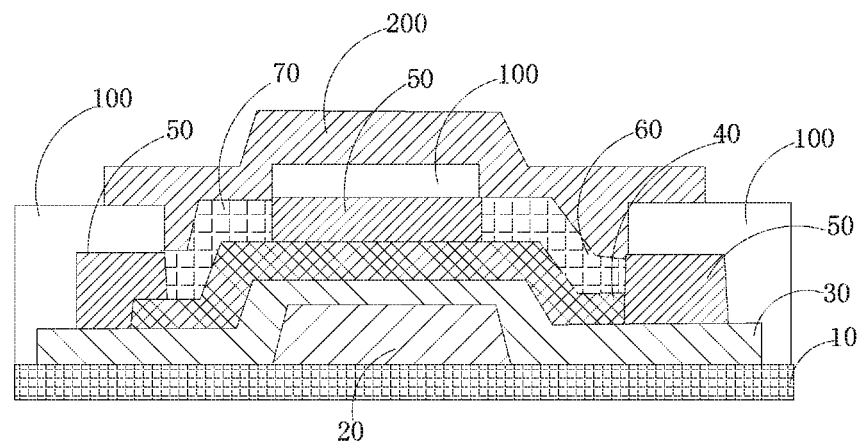

Step S204 comprises following steps:

Step A: Deposit a first metallic layer 200 on the photoresist layer 100, the source blocking layer 60, and the drain blocking layer 70, as FIG. 3D shows. The material of the first metallic layer 200 is copper with the method of PVD.

Figure 3E:
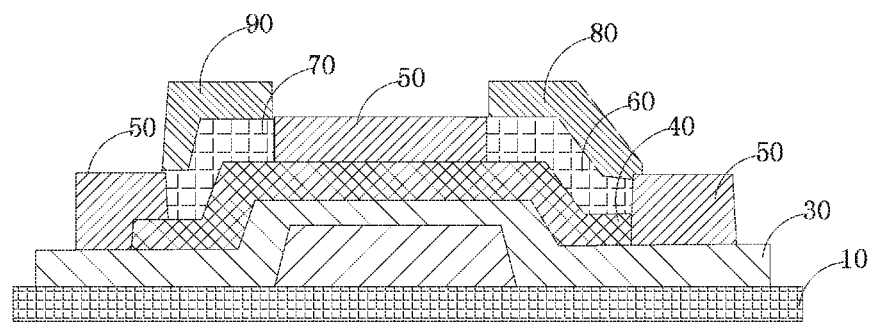

Step B: Peel off the photoresist layer 100 with photoresist. Meanwhile, the part of the first metallic layer 200 arranged on the photoresist layer 100 is removed as well. Further, the source 80 is formed on the source blocking layer 60, and the drain 90 is formed on the drain blocking layer 70, as FIG. 3E shows.

According to the present invention, a method of fabricating the metal oxide TFT proposes doping boron ions and/or phosphorus ions into the blocking spread layer. The benefits of the present invention are to improve the blocking ability of the blocking spread layer to the spread of copper ions of the source and the drain and to prevent copper ions of the source and the drain from spreading to a metal oxide active layer and affecting the ability of electric conductivity of the metal oxide active layer in the environment of high temperature.

While the present invention has been described in connection with what is considered the most practical and preferred embodiments, it is understood that this invention is not limited to the disclosed embodiments but is intended to cover various arrangements made without departing from the scope of the broadest interpretation of the appended claims.

What is claimed is:

1. A metal oxide thin-film transistor (TFT), comprising:
   a glass substrate;
   a gate, arranged on the glass substrate;
   a gate insulating layer, arranged on the gate and the glass substrate;
   a metal oxide active layer, arranged on the gate insulating layer;
   an etching blocking layer, arranged on the metal oxide active layer and the gate insulating layer; a source hole and a drain hole arranged on the etching blocking layer;
   a blocking spread layer, comprising a source blocking layer and a drain blocking layer; the source blocking layer and the drain blocking layer arranged in the source hole and the drain hole, respectively, and connected to the metal oxide active layer; the blocking spread layer doped with boron ions and/or phosphorus ions of predetermined concentration;
   a source, arranged on the source blocking layer;
   a drain, arranged on the drain blocking layer.

2. The metal oxide TFT of claim 1, wherein the blocking spread layer comprises molybdenum (Mo) and titanium (Ti).

3. The metal oxide TFT of claim 1, wherein the metal oxide active layer is an indium gallium zinc oxide (IGZO) active layer.

4. The metal oxide TFT of claim 1, wherein a thickness of the blocking spread layer ranges from 100 Å to 500 Å.

5. The metal oxide TFT of claim 1, wherein the blocking spread layer is doped with the boron ions and the phosphorus ions, and doping concentration of the boron ions and the phosphorus ions ranges from 10% to 90%.

6. The metal oxide TFT of claim 1, wherein the doping concentration gradually decreases from one side of the blocking spread layer near the source and the drain to one side of the blocking spread layer near the metal oxide active layer.

7. An array substrate comprising a metal oxide thin-film transistor (TFT), the metal oxide TFT comprising:
   a glass substrate;
   a gate, arranged on the glass substrate;
   a gate insulating layer, arranged on the gate and the glass substrate;
   a metal oxide active layer, arranged on the gate insulating layer;
   an etching blocking layer, arranged on the metal oxide active layer and the gate insulating layer; a source hole and a drain hole arranged on the etching blocking layer;
   a blocking spread layer, comprising a source blocking layer and a drain blocking layer;
   the source blocking layer and the drain blocking layer arranged in the source hole and the drain hole, respectively, and connected to the metal oxide active layer; the blocking spread layer doped with boron ions and/or phosphorus ions of predetermined concentration;
   a source, arranged on the source blocking layer;
   a drain, arranged on the drain blocking layer.

8. The array substrate of claim 7, wherein the blocking spread layer comprises molybdenum (Mo) and titanium (Ti).

9. The array substrate of claim 7, wherein the metal oxide active layer is an indium gallium zinc oxide (IGZO) active layer.

10. The array substrate of claim 7, wherein a thickness of the blocking spread layer ranges from 100 Å to 500 Å.

11. The array substrate of claim 7, wherein the blocking spread layer is doped with the boron ions and the phosphorus ions, and doping concentration of the boron ions and the phosphorus ions ranges from 10% to 90%.

12. The array substrate of claim 7, wherein the doping concentration gradually decreases from one side of the blocking spread layer near the source and the drain to one side of the blocking spread layer near the metal oxide active layer.

13. The array substrate of claim 7, wherein
the blocking spread layer comprises molybdenum (Mo) and titanium (Ti);
the metal oxide active layer is an indium gallium zinc oxide (IGZO) active layer;
a thickness of the blocking spread layer ranges from 100 Å to 500 Å;
the blocking spread layer is doped with the boron ions and the phosphorus ions, and doping concentration of the boron ions and the phosphorus ions ranges from 10% to 90%; and
the doping concentration gradually decreases from one side of the blocking spread layer near the source and the drain to one side of the blocking spread layer near the metal oxide active layer.

14. A method of fabricating a metal oxide thin-film transistor (TFT), comprising:
forming a gate, a gate insulating layer, a metal oxide active layer, and an etching blocking layer successively on a glass substrate; arranging a source hole and a drain hole on the etching blocking layer;
forming a blocking spread layer on the metal oxide active layer; the blocking spread layer comprising a source blocking layer and a drain blocking layer; arranging the source blocking layer and the drain blocking layer in the source hole and the drain hole, respectively; connecting the source blocking layer and the drain blocking layer to the metal oxide active layer, respectively;
doping boron ions and/or phosphorus ions of predetermined concentration into the blocking spread layer;
forming a source on the source blocking layer, and forming a drain on the drain blocking layer.

15. The method of claim 14, wherein the blocking spread layer is doped with the boron ions and the phosphorus ions, and doping concentration of the boron ions and the phosphorus ions ranges from 10% to 90%.

16. The method of claim 14, wherein the doping concentration gradually decreases from one side of the blocking spread layer near the source and the drain to one side of the blocking spread layer near the metal oxide active layer.

* * * * *